United States Patent [19]
Makino

[11] Patent Number: 6,026,110
[45] Date of Patent: Feb. 15, 2000

[54] DISTRIBUTED FEEDBACK SEMICONDUCTOR LASER WITH GAIN MODULATION

[75] Inventor: Toshihiko Makino, Nepean, Canada

[73] Assignee: Nortel Networks Corporation

[21] Appl. No.: 08/953,015

[22] Filed: Oct. 16, 1997

[51] Int. Cl.[7] .............................. H01S 3/08; H01S 3/19
[52] U.S. Cl. ............................................. 372/96; 372/46
[58] Field of Search .............................. 372/45, 46, 92, 372/96, 102

[56] References Cited

U.S. PATENT DOCUMENTS

| | | | |
|---|---|---|---|
| 5,289,494 | 2/1994 | Tada et al. | 372/96 |
| 5,363,399 | 11/1994 | Yagi | 372/96 |
| 5,506,859 | 4/1996 | Ackerman et al. | 372/96 |
| 5,727,013 | 3/1998 | Botez et al. | 372/96 |

OTHER PUBLICATIONS

H. Kogelnik and C.V. Shank, "Coupled–wave theory of distributed feedback lasers", J. Appl. Phys., vol. 43, No. 5, pp. 2327–2335, (May 1972).

Katsuyuki Utaka, S. Akiba, K. Sakai and Y. Matsushima, "Effect of Mirror Facets on Lasing Characteristics of Distributed Feedback InGaAsP/InP Laser Diodes at 1.5 μm Range", 1984 IEEE, pp. 236–245, (no month avaiable).

K. Utaka, S. Akiba, K. Sakai and Y. Matsushima, "λ/4–Shifted InGaAsP/InP DFB Lasers", IEEE Journal of Quantum Electronics, vol. QE–22, No. 7, Jul., 1986, pp. 1042–1051.

E. Kapon, et al "The Effect of Complex Coupling Coefficients on Distributed Feedback Lasers", IEEE Journal of Quantum Electronics, vol. QE–18, No. 1, Jan. 1982, pp. 66–71.

Y. Luo, Y. Nakano, K. Tada et al., "Purely gain–coupled distributed feedback semiconductor lasers", Appl. Phys. Lett., vol. 56, pp. 1620–1622, 1990, (no month available).

G.P. Li, T. Makino, R. Moore et al., "Partly gain–coupled 1.55 μm strained layer multiquantum well DFB lasers", IEEE Journal of Quantum Electronics, vol. 29, No. 6, Jun. 1993, pp. 1736–1742, 1993.

W.T. Tsang, F.S. Choa, M.C. Wu et al., "Semiconductor distributed feedback lasers with quantum well superlattice gratings for index or gain–coupled feedback", Appl. Phys. Lett., vol. 60, No. 21, pp. 2580–2582, 1990, (May 1992).

J. Hong, K. Leong, T Makino et al., "Impact of random facet phase on modal properties of partly gain–coupled DFB lasers", J. Selected Topics on Quantum Electronics, vol. 3, No. 2, pp. 555–568, (Apr. 1997).

G.P. Li, T. Makino, R. Moore and N Peutz, "1.55 μm Index/Gain Coupled DFB Lasers with Strained Layer Multiquantum–well Active Grating", Electronics Letters, Aug. 27, 1992, vol. 28, No. 18, pp 1726–1727.

Lu et al, High–Power and High Speed Performance of 1.3–μm Strained MQW Gain–Coupled DFB Lasers, 1995 IEEE Journal of Selected Topics in Quantum Electronics, vol. 1, No. 2, Jun. 2, 1995, pp. 375–381.

*Primary Examiner*—Rodney Bovernick
*Assistant Examiner*—Quyen Phan Leung
*Attorney, Agent, or Firm*—Victoria Donnelly; Angela C. de Wilton

[57] ABSTRACT

The invention provides a complex coupled distributed feedback (DFB) semiconductor laser device with energy band gap modulation. The device comprises an active region formed on a substrate, and a barrier region adjacent the active region, the energy band gap of the barrier region modulated along a cavity length direction to form a complex coupled grating. The modal gain is higher in the barrier region areas, having narrower energy band gap, due to higher material gain and higher optical confinement factor in these areas. Periodic modulation of the energy band gap of the barrier region produces gain (or loss) modulation and index modulation in the material of the active region, thus, gain coupling and index coupling mechanisms being provided. Methods of producing gain modulation in the DFB laser, and fabrication thereof are also provided.

35 Claims, 7 Drawing Sheets

DISTRIBUTED FEEDBACK SEMICONDUCTOR LASER WITH GAIN MODULATION

FIELD OF INVENTION

The invention relates to semiconductor lasers, and in particular, to complex coupled distributed feedback (DFB) semiconductor lasers with energy band gap modulation, methods of producing gain/loss modulation, and fabrication such lasers.

BACKGROUND OF THE INVENTION

Long haul high capacity fiber optics communication systems require high performance light emitting sources capable of generating single mode, narrow spectral linewidth radiation in the 1.3–1.56 μm wavelength range. Some of the existing semiconductor lasers, for example, InGaAsP DFB lasers can meet requirements for high power and proper wavelength, but a high dynamic single mode yield is difficult to achieve.

Conventional index coupled DFB lasers employing an index corrugation have an inherent problem in existence of two longitudinal modes across a laser stop band, a right Bragg mode and a left Bragg mode, having equal threshold gain. It inevitably results in poor single mode operation as shown, for example, in the article by H. Kogelnik and C. V. Shank "Coupled-mode theory of distributed feedback lasers", J. Appl. Phys., vol. 43, no. 5, pp. 2327–2335, 1972. One of the known approaches to the solution of this problem is asymmetric coating of laser facets, as shown, for example, in the publication by K. Utaka, S. Akiba, K. Sakai and Y. Matsushima "Effect of Mirror Facets on Lasing Characteristics of Distributed Feedback InGaAsP/InP Laser Diodes at 1.5 μm Range". Asymmetric coating of facets of the laser results in asymmetric losses for two degenerate longitudinal modes, and consequently in different threshold gains for these modes. The final single mode yield in such lasers, however, is relatively low because of the random facet phases introduced by cleaving. Another approach to single mode generation is incorporation of a quarter-wave phase shift along a direction of propagation of one of the two degenerate longitudinal modes, as shown, for example, in the artfile by K. Utaka, S. Akiba, K Sakai, and Y. Matsushima "λ/4-Shifted InGaAsP/InP DFB Lasers". Although this type of DFB lasers with perfect anti-reflection (AR) coatings can theoretically provide up to 100% of a single mode yield, the yield of these lasers deteriorates rapidly with small changes in reflectivity of two modes. Usually, even a few percent difference in mode reflectivity can invalidate a single mode generation completely. Furthermore, the output power of these lasers is relatively low. Due to the laser symmetry, almost half of the power is emitted and wasted from one of the other laser facets. Moreover, a phenomenon known as a spatial hole-burning, the reduction of carrier density caused by high photon density in the center of a laser cavity, substantially deteriorates a side mode suppression ratio and the output power of such lasers at high current injection levels.

An alternative approach to breaking the mode degeneracy in DFB lasers is an introduction of gain coupling mechanism as predicted by H. Kogelnik and C. V. Shank (see the reference on page 1). In complex coupled (gain coupled or loss coupled) DFB lasers, a periodic optical gain or loss modulation in the presence of conventional index corrugation along the laser cavity effectively breaks the mode degeneracy between the two Bragg modes around the stop band of the DFB lasers, and thus avoids a serious and inherent problem for conventional index coupled DFB lasers, as predicted by E. Kapon, A. Hardy, and A Katzir in the publication "The Effect of Complex Coupling Coefficients on Distributed Feedback Lasers". These pure gain coupled and complex coupled DFB lasers have been demonstrated, for example, in publications by Y. Luo, Y. Nakano, K. Tada et al. "Purely gain-coupled distributed feedback semiconductor lasers", Appl. Phys. Lett., vol. 56, pp. 1620–1622, 1990, and G. P. Li, T. Makino, R. Moore et al. "Partly gain-coupled 1.55 μm strained layer multi-quantum well DFB lasers", IEEE J. Quantum Electronics, vol. QE-29, pp. 1736–1742, 1993. With introduction of even a small amount of gain or loss coupling, the dynamic single mode yield of complex coupled DFB lasers increases drastically. It effectively provides lasing predominantly on a preferred and fixed Bragg mode among the two originally degenerate ones around a stop band, regardless of random distribution of unknown laser facet phases. In in-phase gain coupled DFB lasers, the higher index region within a grating period has a higher optical modal gain, resulting in lasing mainly of the right Bragg mode with the lasing wavelength longer than the Bragg wavelength. Both theory and experiments have confirmed this conclusion. For anti-phase loss coupled DFB lasers, the higher index region within a grating period experiences higher optical loss, resulting primarily in lasing of the left Bragg mode with the lasing wavelength shorter than the Bragg wavelength.

Complex coupled DFB lasers have been studied intensively by different scientific groups. It has been demonstrated they have many advantages over conventional index coupled lasers, such as high single mode sensitivity, less sensitivity to external reflections, high modulation bandwidth and reduced wavelength chirp. That is why it is considered that these lasers constitute a good candidate for practical applications in fiber optics communication systems. Some of the recent achievements are reported in the following publications: W. T. Wsang, F. S. Choa, M. C. Wu et al. "Semiconductor distributed feedback lasers with quantum well superlattice gratings for index or gain-coupled feedback", Appl. Phys. Lett., vol. 60, pp. 2580–2582, 1990 and J. Hong, K. Leong, T Makino et al. "Impact of random facet phase on modal properties of partly gain-coupled DFB lasers", J. Selected Topics on Quantum Electronics, vol. 3, no. 2, pp. 555–568, 1997.

Among other complex coupled DFB lasers, multiple quantum well (MQW) lasers with etched quantum wells appear to provide the highest performance operation up to date. Additionally, by utilizing compressively strained MQW structure to enhance the differential gain, the speed of the devices has been increased substantially. For example, the article by G. P. Li, T. Makino, R. Moore and N. Puetz "1.55 μm index/gain coupled DFB lasers with strained layer multiquantum-well active grating", Electronics Letters, vol. 28, no. 18, pp. 1726–1727, 1992, describes a partly gain coupled (mixed index and gain coupled) DFB laser, having a MQW active grating. The grating is patterned by etching grooves through all MQW layers of the active region and regrowing InP buffer material in the etched grooves. The high corrugation region in the groove, having more quantum wells, provides a higher modal gain and real modal index than the low corrugation region in the groove, thus, providing gain and index coupling mechanisms. However, an external quantum efficiency of this type of laser is limited by high index coupling, losses in the groove regions where there is no gain medium, and leakage current from the bottom of the grooves to the n-side confinement region.

Another MQW DFB laser with improved characteristics is described in the article by H. Lu, C. Blaauw, B. Benyon et al. "High-Power and High-Speed Performance of 1.3-mm Strained MQW Gain-Coupled DFB Lasers", IEEE J. of Selected Topics in Quantum Electronics, vol. 1, no. 2, pp. 375–381, 1995. The laser comprises a MQW grating structure similar to that described above with the only difference that the grating grooves are patterned through the several top quantum well layers only, and some of the bottom quantum well layers are not etched. This type of the DFB laser exhibits higher quantum efficiency due to existence of some gain medium in low corrugation regions in the grooves.

Nevertheless, an efficient control of coupling coefficients is still limited. Fabrication of these lasers is quite complicated, because it requires high precision controlled etching through the active region to avoid damage to the active layers. Additionally, it is difficult to control gaih and index coupling independently, because both ipdex and gain coupling are determined by the etching depth.

Therefore there still exists a continued demand for the development of alternative structures of the DFB semiconductor lasers, providing simplified fabrication process, while providing high essential parameters of the lasers.

SUMMARY OF THE INVENTION

Thus, the present invention seeks to provide a distributed feedback complex coupled semiconductor laser with energy band gap modulation, methods of producing gain/loss modulation, and fabrication thereof.

Thus, according to one aspect of the present invention there is provided a distributed feedback complex coupled semiconductor laser device, comprising:

a substrate;

an active region formed on the substrate;

a barrier region adjacent the active region, the energy band gap of the barrier region modulated along a cavity length direction to form a complex coupled grating; and means for creating a population inversion in the active region.

Thus, a DFB semiconductor laser device with energy band gap modulation is provided. Beneficially, the active region of the laser comprises a multiple quantum well structure, and the barrier region is formed just above or under the active region. Conveniently, the grating is defined in the barrier region only, and having a corrugation period comprising a plurality of sections filled by preselected quantum barrier compositions. Number of barrier compositions, forming a grating period, is less or equal to a number of sections in the grating period, i.e. each section may be filled by different barrier compositions, or some sections may be filled by the same barrier composition. Height and shape of the sections define the grating corrugation period. Preferably, sections have a rectangular or trapezoidal shape. Varying height and shape of the sections provides control of modal index coupling which may be controlled independently from the modal gain coupling. Beneficially, the grating is a first order uniform grating. Alternatively it may be a chirped grating.

Excitation means for pumping the laser comprises electrical contacts for current injection into the active region of the laser. Alternatively, the semiconductor device may be capable of coupling to an external optical pumping source to create a population inversion. Beneficially, electrodes are formed on a top of the current confining region of the laser and at a bottom of the substrate. The current confining region is preferably a ridge waveguide or a buried hetero-structure.

According to another aspect of the invention there is provided a distributed feedback complex coupled semiconductor laser device, comprising:

a semiconductor substrate;

an active region formed thereon, and comprising a multiple quantum well structure, comprising a plurality of quantum well layers;

a barrier region formed over or under the active region, and comprising a complex coupled grating defined in the barrier region only, the grating not extending beyond barrier region into the active region, and having a corrugation period comprising a first and a second sections filled by a first and a second quantum barrier compositions;

a current confining ridge over the active region; and contacts to the current confining ridge and the substrate to provide a current injection into the active region.

Thus, the grating, providing energy band gap modulation, is defined above or below the active region and has a grating period, comprising two sections, beneficially filled by InP and InGaAsP compositions correspondingly. A height and a shape of the first and second sections define the grating corrugation period. Varying height and shape of the grating period sections provides modal index coupling which may be controlled independently of modal gain coupling. The sections may have a rectangular or trapezoidal shape. Beneficially, the grating is a first order uniform grating. Alternatively, the grating may be a chirped grating.

By corresponding selection of semiconductor materials and type of dopings for substrate and current confining ridge, the laser is adjusted to generate light within certain wavelength ranges. Preferably, they are 1.3–1.56 $\mu$m and 0.8–0.9 $\mu$m for InP and GaAs alloys utilized as substrate materials correspondingly.

According to another aspect of the present invention there is provided a method of producing a gain/loss modulation in a distributed feedback complex coupled semiconductor laser device, comprising the step of:

modulating an energy band gap of a barrier region along a cavity length direction, the barrier region adjacent an active region.

Additionally, defining a grating in the barrier region, the grating having a corrugation period comprising a plurality of sections filled by preselected quantum barrier compositions, and varying height and shape of the sections, provides an independent control of modal index coupling.

According to yet another aspect of the present invention there is provided a method of fabrication a distributed feedback complex coupled semiconductor laser device, comprising the steps of:

providing a substrate;

forming an active region thereon;

forming a barrier region adjacent the active region, the energy band gap of the barrier region modulated along a cavity length direction to form a complex coupled grating; and providing means for creating a population inversion in the active region.

Beneficially, forming the active region comprises growing a multiple quantum well structure on the substrate, and the next step of forming the barrier region comprises forming the barrier region just over or under the active region. Forming the barrier region also comprises defining a complex coupled grating in the barrier region only, the grating having a corrugation period comprising a plurality of sections filled by preselected barrier compositions, a height and a shape of the sections defining the grating period. The step of providing means for creating a population inversion in the active region comprises forming electrical contacts for current injection into the active region of the laser. Alternatively, it may comprise forming optical pumping means for pumping the laser from an external source.

Additionally, fabrication of the laser comprises growing capping and cladding layers above the active region, forming a current confining ridge, and contacts to the ridge and substrate for current injection into the active region.

Thus, a DFB semiconductor laser device with energy band gap modulation, and methods of gain/loss modulation, and fabrication thereof is provided. The advantage of the laser is that the structure is simplified substantially by avoiding high precision etching through the active region, and providing gain/loss modulation by forming a grating in the barrier region only, the grating not extending into the active region.

BRIEF DESCRIPTION OF THE DRAWINGS

The invention will now be described in greater detail with reference to the attached drawings in which.

DESCRIPTION OF THE PREFERRED EMBODINENTS

STRUCTURE

Figure 1:
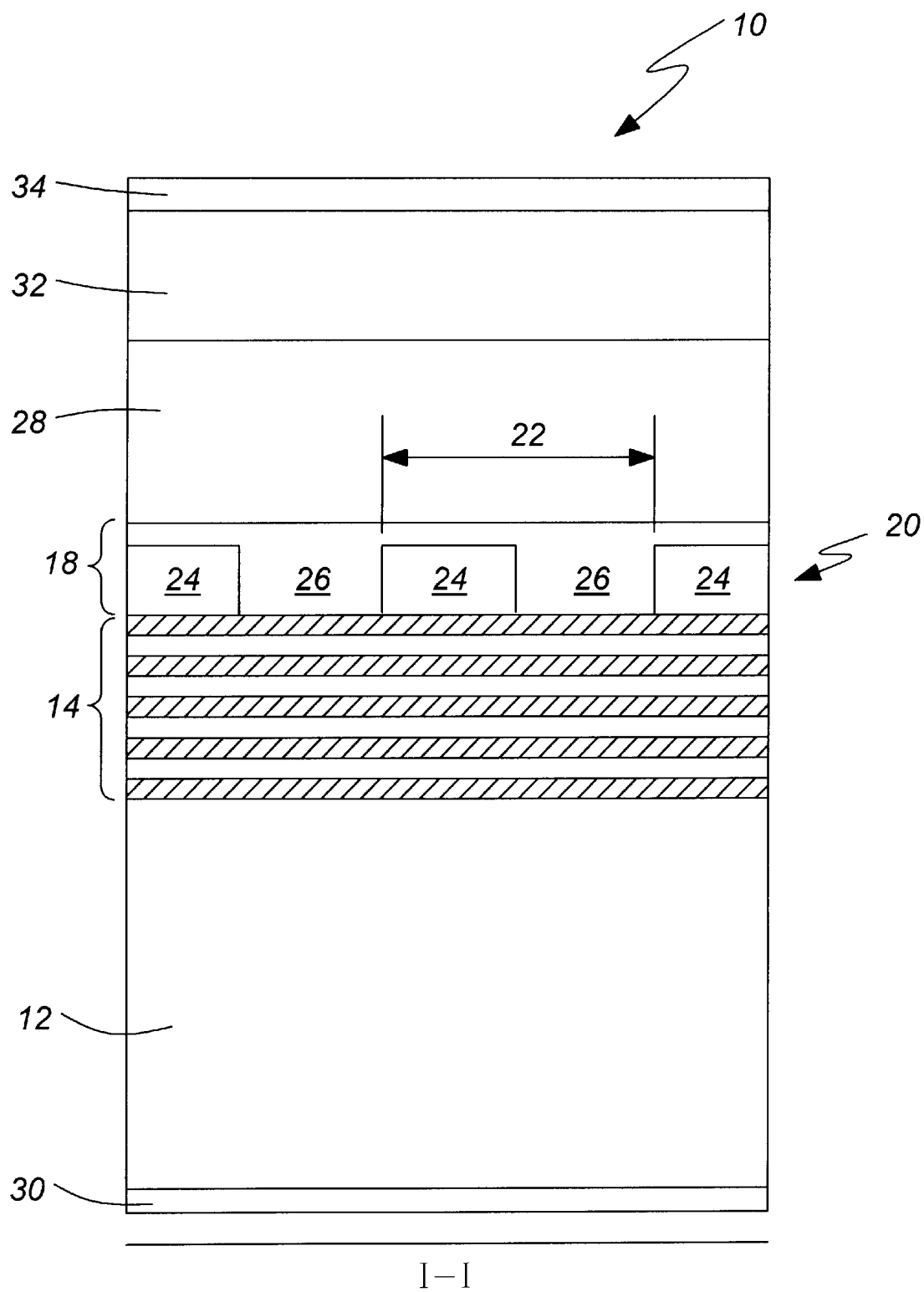
FIG. 1 is a schematic cross-sectional view of the DFB laser according to the first embodiment of the invention.

A schematic cross section through a distributed feedback complex coupled laser device 10 according to a first embodiment of the present invention is shown in FIG. 1. The device 10 comprises a substrate 12 providing a first confinement region, an active region 14 comprising a multiple quantum well (MQW) structure 16, and a barrier region 18 above the active region. A complex coupled grating 20 is defined in the barrier region only, providing the energy band gap modulation in the barrier region 18 along a cavity length direction, shown by the arrows I—I in FIG. 1. Notably, the grating 20 does not extend into the active region. The grating 20 has a corrugation period 22 comprising two sections 24, 26 filled by preselected quantum barrier compositions. A second confinement region 28, and means for excitation the laser device complete the structure. Excitation means comprises contact to the substrate 30, a current confining ridge 32, and a top electrode 34 defined thereon for current injection into the active region.

Figure 2:
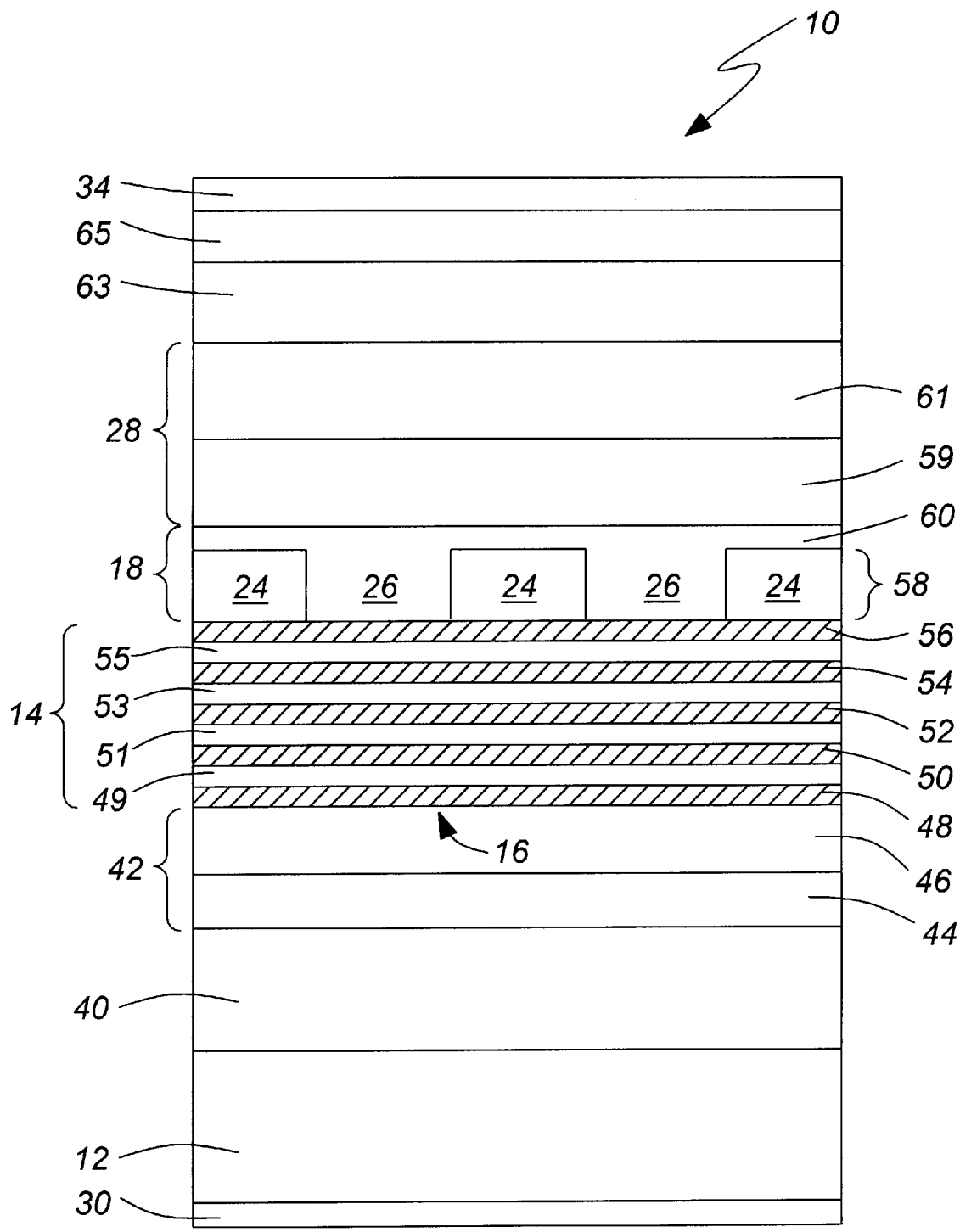
FIG. 2 is a detailed cross-sectional view of the DFB laser according to the first embodiment of the invention.

The structure is shown in more detail in FIG. 2, which shows an oblique cross-sectional view through the laser device structure 10. A DFB semiconductor laser device 10 is fabricated from Group III-V semiconductor materials, and comprises a heavily doped N-type InP substrate 12, on which N-doped InP buffer layer 40 of 1.5 mm thickness is defined. The first separate confinement region 42, consisting of two confinement layers 44 and 46 of N-doped InGaAsP with energy band gaps corresponding to wavelengths of 1.15 $\mu$m and 1.25 $\mu$m respectively, is provided over the buffer layer 40. The thickness of each confinement layer is 30 nm. The active region 14 overlies the confinement region 42 and comprises a multiple quantum well structure 16 which includes five 1% compressively strained quantum wells (four N-doped InGaAsP layers and one InGaAs layer) separated by four N-doped InGaAsP unstrained barriers. The first three quantum well layers 48, 50 and 52, each being 5.5 nm thick, are tailored so as to provide a first transition energy of the quantum well around 0.83 eV, which corresponds to $\lambda$=1.50 $\mu$m. The first three barrier layers 49, 51, 53 have a band gap energy, corresponding to wavelength of 1.25 $\mu$m, each layer being 10 nm thick. The fourth quantum well layer 54 has the same composition as three previous quantum well layers, namely N-doped InGaAsP, but slightly different thickness of 6–7 nm so as to provide a first transition energy around to 1.55 $\mu$m. The fourth barrier layer 55 is made of InP composition with energy band gap 1.35 eV, the layer being 10 nm thick. The fifth, the top most quantum well layer 56 of InGaAs, is formed next, the layer having 8.5 nm thickness corresponding to the wavelength of 1.55 $\mu$m. A 30–70 nm thick InP layer 58 having the energy band gap 1.35 eV is grown on top of the last QW.

A grating structure 20 is defined therein by periodically etched grooves through the barrier layer 58 as will be described in more detail below. The corrugation period 22 of the grooves is selected so as to define a first order grating for the lasing wavelength.

A P-doped InGaAsP layer 60, having a band gap energy 0.95 eV (corresponding to wavelength 1.3 $\mu$m) smaller than the energy band gap of the barrier layer 58, fills the grooves to make a flat surface which is slightly above the top of the InP barrier layer 58. Thus, a grating structure 20, providing energy band gap modulation along a cavity length direction in the barrier region 18, is defined. Each period 22 of the grating consists of two sections, the first section 24 and the second section 26 filled by P-doped InP and P-doped InGaAsP compositions correspondingly. The grating 20 surrounds the most top quantum well layer 56 at the top, the InP buffer layer 55 surrounding the quantum well layer 56 at the bottom. The second separate confinement region 28, including two buffer layers of P-doped InP 59 and 61, 40 nm and 80 nm thick respectively, followed by 1.6 $\mu$m cladding layer 63 of P-doped InP and 0.2 $\mu$m capping layer 65 of P-doped InGaAs, complete the structure.

Thus, a DFB semiconductor laser 10 with an energy band gap modulation along a cavity length direction due to the complex coupled structure 20 formed in the barrier region 18 adjacent the active region 14 is provided. The advantage of the structure is that the grating is defined in the barrier region only, and the laser structure is simplified substantially by avoiding high precision etching through the MQW layers of the active region. As shown below, energy band gap modulation in the barrier region results in gain/loss modulation in the active region, thus, gain/loss coupling mechanism and single mode laser operation being provided.

While the laser device described above is fabricated on a N-type substrate wafer, alternatively, a complimentary structure may be fabricated on a P-type wafer.

The substrate 12 on which the laser device 10 described above is fabricated is made of InP material which results in generating a laser light within a range of 1.3–1.56 $\mu$m, corresponding to a transparency window of this material. In modifications of this embodiment, the substrate may be made of GaAs material, having a window of transparency in a shorter wavelength range of 0.8–0.9 μm, which results in generating light in this wavelength range. More precise calculation of a lasing wavelength depends also on the properties of the active region and the grating structure. In the laser cavity direction, for lasing to occur, the grating period is determined by an integer multiple of λ/2n where λ is very close to the desired lasing wavelength, (typically within several nm), and n is the modal index, usually in a range of 3–4 for semiconductor materials.

The grating structure 20 in this embodiment has a corrugation period 22, consisting of two section 24 and 26 filled by two different quantum barrier compositions. In modifications of this embodiment, the grating may have a corrugation period, consisting of a plurality of sections, filled by quantum barrier compositions, thus the grating being a multi-section period grating. Number of quantum barrier compositions may be less or equal to a number of the sections forming the grating corrugation period, i.e. each section may be filled by a different barrier composition, or some sections may be filled by the same barrier composition. Height and shape of the sections define the grating corrugation period. Preferably, sections have a rectangular or trapezoidal shape. Beneficially, the grating is a first order uniform grating. Alternatively it may be a chirped grating.

Figure 3:
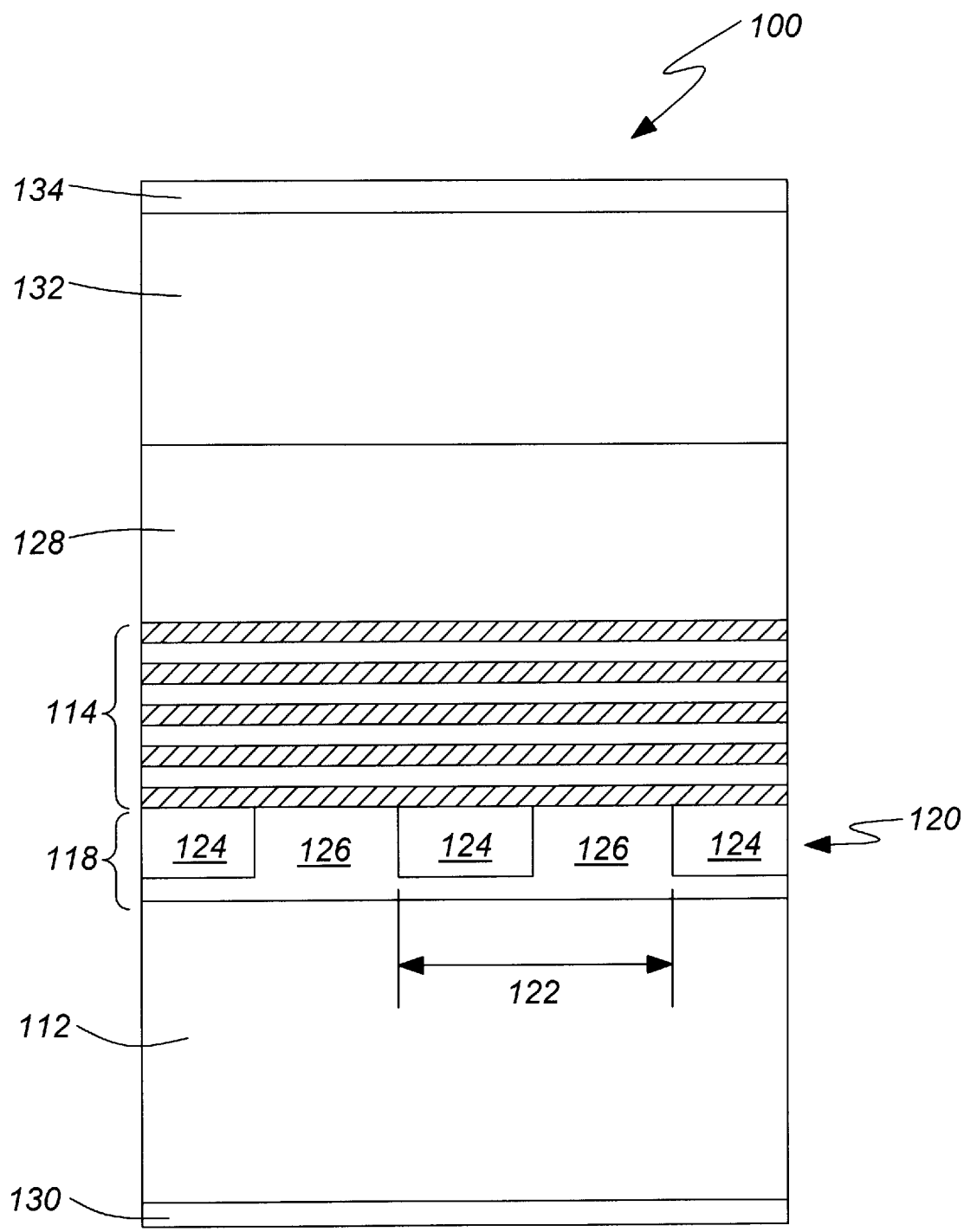
FIG. 3 is a schematic cross-sectional view of the DFB laser according to the second embodiment of the invention.

A semiconductor laser 100 according to a second embodiment of the invention is schematically shown in FIG. 3. Its structure is similar to that of the first embodiment except for the barrier region 18 incorporating a grating structure 20 is formed under the active region 14. It comprises a substrate 112 providing a first confinement region, an active region 114 comprising a multiple quantum well (MQW) structure 116, and a barrier region 118 under the active region. A complex coupled grating 120 is defined in the barrier region 118, providing the energy band gap modulation in the barrier region along a cavity length direction, shown by arrows II—II in FIG. 3. The grating 120 is defined in the barrier region only, and has a corrugation period 122 comprising two sections 124, 126 filled by preselected quantum barrier compositions, which are P-doped InP and P-doped InGaAsP correspondingly in this embodiment. A second confinement region 128, formed on the MQW region, and means for excitation the laser, comprising contact to the substrate 130, a current confining ridge 132, and a top electrode 134 defined thereon, complete the structure.

Figure 4:
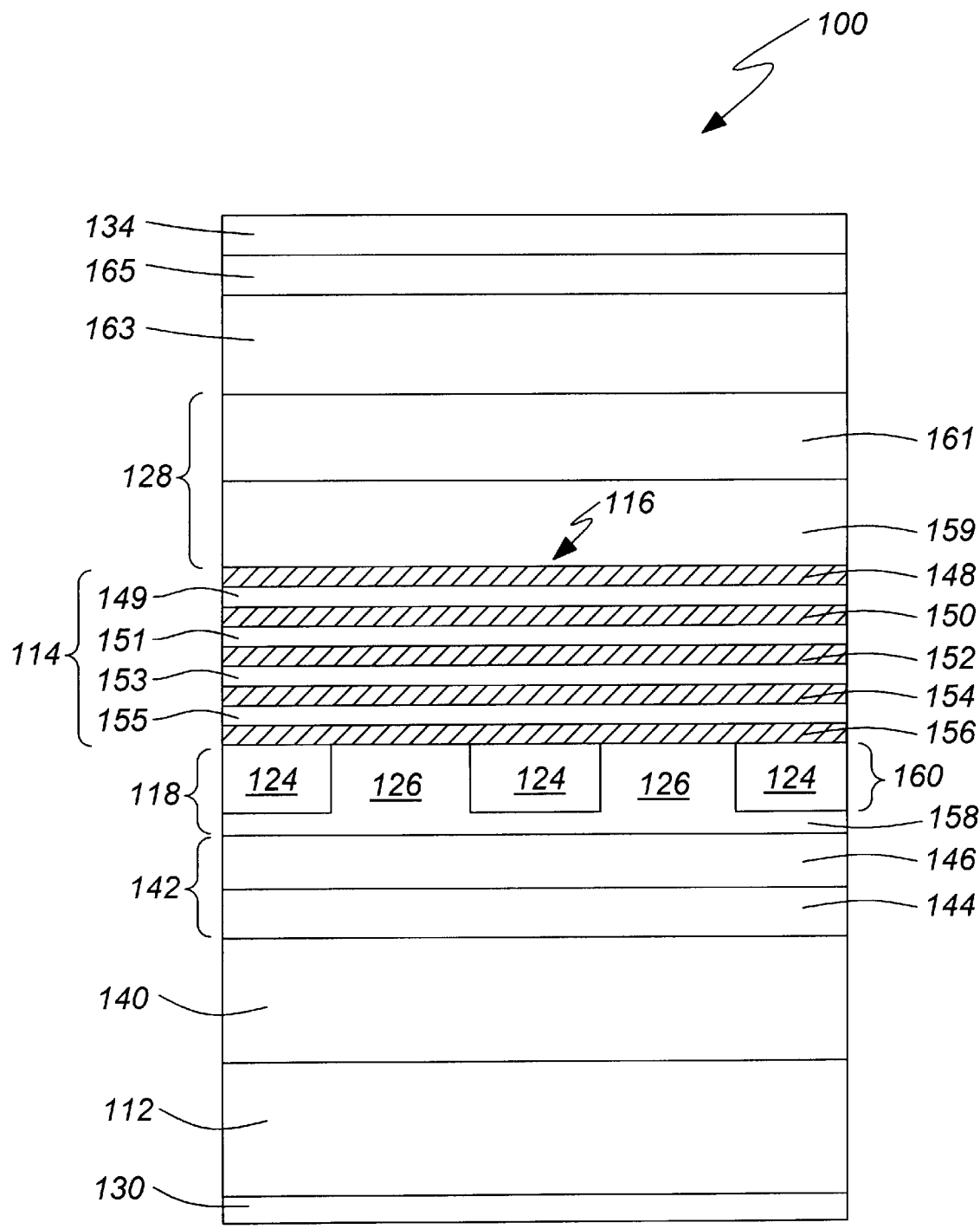
FIG. 4 is a detailed cross-sectional view of the DFB laser according to the second embodiment of the invention.

The structure is shown in more detail in FIG. 4, which shows a oblique cross-sectional view through the laser device structure 100. A DFB semiconductor laser device 100 is fabricated from Group III-V semiconductor materials, and comprises a heavily doped N-type InP substrate 112, on which N-doped InP buffer layer 140 of 1.5 mm thickness is defined. The first separate confinement region 142, consisting of two confinement layers 144 and 146 of N-doped InGaAsP with energy band gaps corresponding to wavelengths of 1.15 μm and 1.25 μm respectively, is provided over the buffer layer 140. The thickness of each confinement layer is 30 nm.

A 30–70 nm thick InGaAsP barrier layer 158 having the energy band gap 0.95 eV is grown next.

A grating structure 120 is defined therein by periodically etched grooves through the barrier layer 158. The corrugation period of the grooves is selected so as to define a first order grating for the lasing wavelength.

A P-doped InP layer 160, having a band gap energy 1.35 eV smaller than the energy band gap of the barrier layer 158, fills the grooves. Thus, a grating structure 120, providing energy band gap modulation along a cavity length direction in the barrier region 118, is defined. Each period 122 of the grating consists of two sections, the first section 124 and the second section 126 filled by P-doped InP and P-doped InGaAsP compositions correspondingly. The grating 120 surrounds the most bottom quantum well layer 156 at the bottom, the InP buffer layer 155 surrounding the quantum well layer 156 at the top.

The active region 114 overlies the barrier region 118 and comprises a multiple quantum well structure 116 which includes five 1% compressively strained quantum wells (four N-doped InGaAsP layers and one InGaAs layer) separated by four N-doped InGaAsP unstrained barriers.

The first, the most bottom quantum well layer 156 is formed of InGaAs, the layer having 8.5 nm thickness corresponding to the wavelength of 1.55 μm. The first 10 nm thick barrier layer 155, overlying the first QW layer, is made of InP composition with energy band gap 1.35 eV. The second quantum well layer 154 is made of N-doped InGaAsP, and has a thickness of 6–7 nm so as to provide a first transition energy around 1.55 μm. The last three quantum well layers 152, 150 and 148, each being 5.5 nm thick, are tailored so as to provide a first transition energy of the quantum well around 0.83 eV, which corresponds to λ=1.50 μm. The last three barrier layers 153, 151, 149 have a band gap energy, corresponding to wavelength of 1.25 μm, each layer being 10 nm thick.

The second separate confinement region 128, comprising two layers of P-doped InP, 159 and 161, 40 nm and 80 nm thick respectively, followed by 1.6 μm cladding layer 163 of P-doped InP and 0.2 μm capping layer 165 of P-doped InGaAs, complete the structure.

Figure 5:
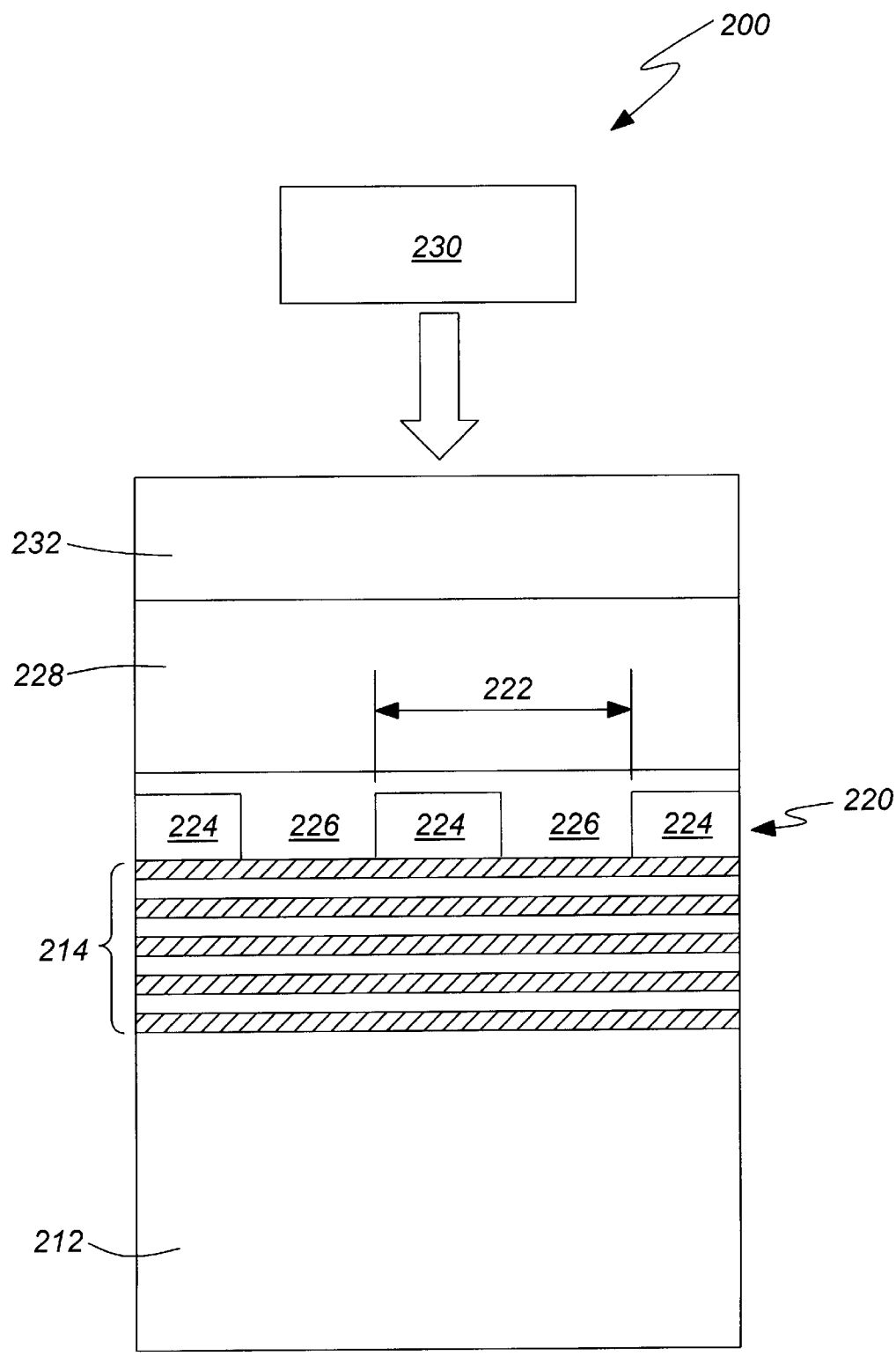
FIG. 5 is a schematic cross-sectional view of the DFB laser according to the third embodiment of the invention.

The semiconductor laser of the embodiments described above are semiconductor diode laser structures, i.e., have contacts 30 and 34 for electrical excitation of the active region by current injection. It is also contemplated that a semiconductor laser device 200 of yet another embodiment, shown in FIG. 5, may be provided with optical pumping means 230, replacing corresponding electrical contacts 30 and 34 of the first embodiment or electrical contacts 130 and 134 of the second embodiment, e.g., by providing population inversion with suitable optical coupling to a another light source on the substrate. The laser 200 according to this embodiment comprises an excitation means 230 for creating a population inversion in the active region. The rest of the structure of the laser device 200 is similar to that of the previous embodiments described above. It comprises a substrate 212 providing a first separate confinement region, an active region 214 comprising a MQW structure 216 and a grating structure 220 defined in the barrier region 218 only, the barrier region formed above the active region. An overlying confinement region 228, formed on the MQW region 214, and a current confining ridge 232 complete the structure. Alternatively, the barrier region 218 may also be grown under the active region 214 as described in detail in the second embodiment of the invention. The grating structure 220 may comprise two section period grating as described in the first embodiment, or alternatively, a multi-section period grating as discussed above, the grating structure 220 being uniform or chirped.

In the embodiments described above the semiconductor laser is a ridge waveguide laser device. It is also contemplated that a semiconductor laser device in alternative embodiments may be a buried heterostructure device. A buried heterostructure laser may also comprise grating, having two section or multi-section period as described above, the grating structure being uniform or chirped.

OPERATION

Principles of operation, demonstrated on a complex coupled DFB laser 10 of the first embodiment of the invention, are as follows. The wavelength corresponding to a transition between the first quantized levels of conduction and valence bands of a QW is given in the article by T. Makino "Analytical Formulas for the Optical Gain of Quantum Wells", IEEE Journal of Quantum Electronics, vol. 32, no. 3, pp. 493–501, 1996

$$\lambda = \frac{1.24}{E_g + E_c + E_v} \quad (1)$$

where $E_g$ is the energy band gap, and $E_c$ and $E_v$ are the quantized energy levels in the conduction and valence bands, respectively. $E_c$ can be approximated as $$E_c = \left[\frac{\pi}{2} \frac{a_c}{W + \Delta W_c}\right]^2 \quad (2)$$

where $$\Delta W_c = \frac{a_c}{\sqrt{b_c \Delta E_c}} \quad (3)$$

where $$a_c = \frac{2\hbar}{\sqrt{2m_{cw}}}, b_c = \frac{m_{cw}}{m_{cb}} \quad (4)$$

$\Delta E_c$ is the discontinuity of the band edge of the conduction band, $\hbar$ is Planck's constant divided by $2\pi$, W is the well width, and $m_{cw}$ and $m_{cb}$ are the effective masses of electrons inside of the well, and the barrier, respectively. $E_v$ for the valence band can be expressed by the equation (2) if the subscript "c" is replaced by a subscript "v". It can be seen from equation (2) that the larger $\Delta E_c$ ($\Delta E_v$) gives larger $E_c$, which in turn gives shorter first transition wavelength $\lambda$ in equation (1). It means that the barrier having a wider energy band gap has shorter first transition wavelength for a given QW. Therefore, the gain of the quantum well may be changed by changing the barrier composition, and thus, a method of producing a gain modulation in a complex coupled DFB laser may be developed.

Figure 6:
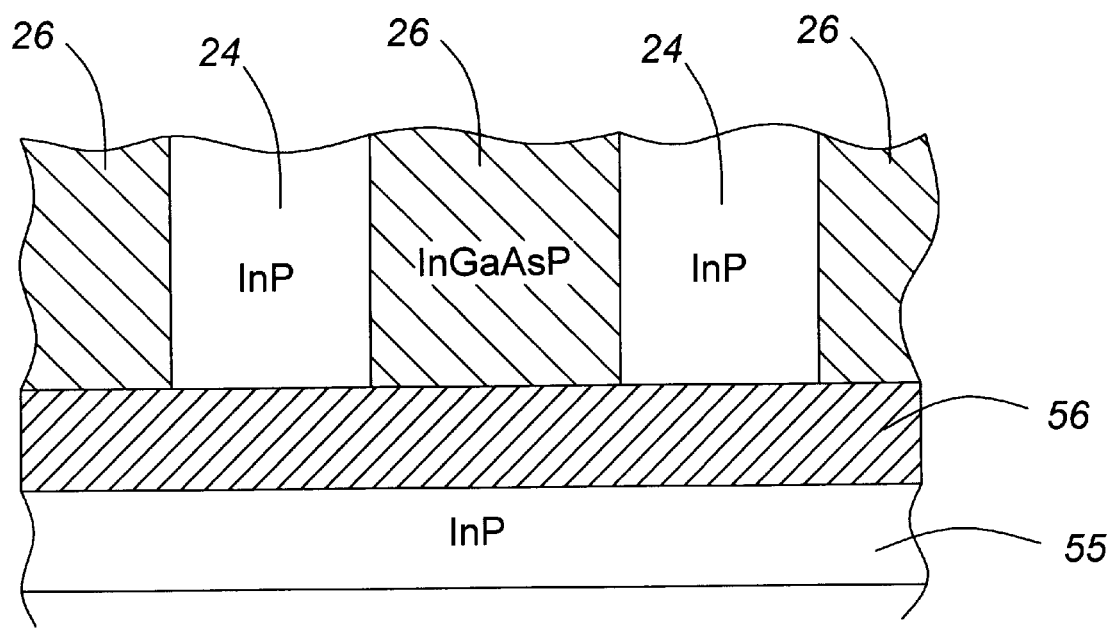
FIG. 6 is a layer structure in the vicinity of the topmost active layer of the DFB laser according to the first embodiment of the invention.

FIG. 6 shows the vicinity of the topmost quantum well layer 56. There are two grating sections filled by different barrier compositions: the one is the section 26 filled by a InGaAsP barrier on one side of the quantum well 56 and InP barrier layer 55 on the other side, and the other one is the section 24 with InP barriers 24 and 55 on both sides of the quantum well layer 56.

Figure 7:
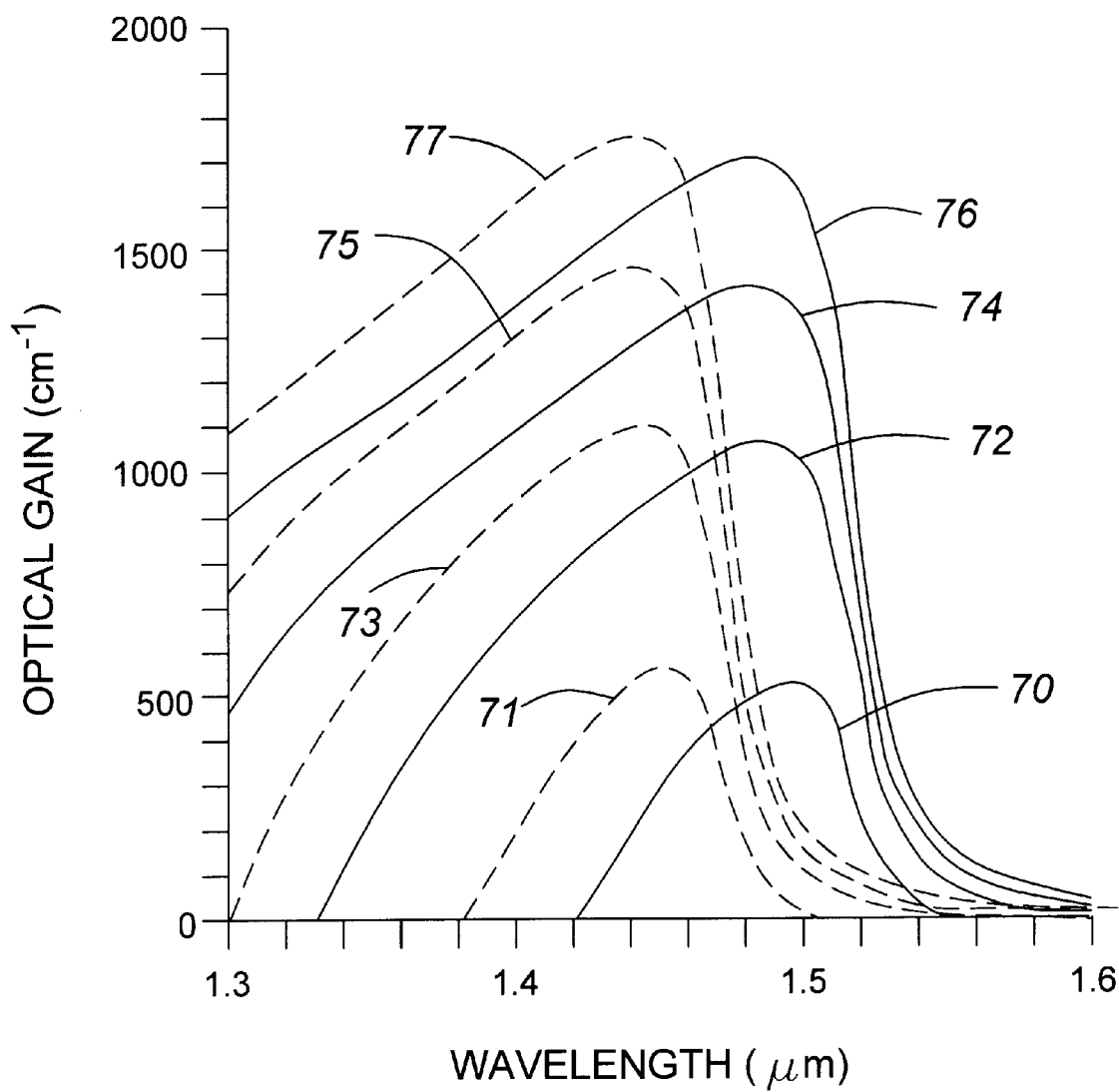
FIG. 7 is calculated optical gain for different grating period sections for the DFB laser according to the first embodiment of the invention.

FIG. 7 shows calculated optical gains for a 8.5 nm-thick InGaAs well for the two sections 26 and 24 of FIG. 6. The solid line curves 70, 72, 74, 76 on the FIG. 7 correspond to the section 26 and various carrier densities of the MQW structure, namely, to $2.10^{18}$ cm$^{-3}$, $3.10^{18}$ cm$^{-3}$, $4.10^{18}$ cm$^{-3}$, and $5.10^{18}$ cm$^{-3}$ respectively. The dashed line curves 71, 73, 75, 77 correspond to the section 24 and the same corresponding carrier densities mentioned above. As follows from the FIG. 7, for every given carrier density, gain in the topmost quantum well layer 56 differs for sections 24 and 26 of the grating period, being higher for the section 26 filled by InGaAsP composition, which results in gain modulation along the cavity length direction of the laser. As a result a modal gain, i.e. gain for a particular mode structure in the laser, is also higher for the section 26. Furthermore, the section 26 has a higher real refractive index than the section 24 because the refractive index of InGaAsP is higher than that of InP. Therefore the section 26 has a higher optical confinement factor than the section 24, and as a result, higher modal index. The confinement factor defines how much of optical field is confined in the active region, more precisely, the percentage of optical field intensity confined in the active region. The modal index of each grating period section, i.e. the refractive index for a particular mode structure propagating along the laser cavity length direction, depends on two parameters: refractive index of the composition filling the corresponding section of the grating period (InP or InGaAsP in our example), and height and shape of the section. Varying quantum barrier compositions, filling the sections 24 and 26 of the grating period, we vary the optical gain and refractive index of the sections. Additionally, by varying height and shape of the sections 24 and 26, we may vary modal index coupling independently of the gain coupling for these sections, and thus, provide independent control of gain and index modulation in the DFB laser.

Principles of operation of the DFB semiconductor laser according to another embodiments of the invention remain similar to that one described above. In the second embodiment of the invention, the barrier region is located under the most bottom quantum well layer, providing energy band gap modulation and optical confinement factor modulation in the most bottom quantum well layer, modal gain and modal index coupling being controlled independently by varying height and shape of the grating period sections. Varying number of sections and quantum barrier compositions filling the sections, provides a precise control of gain and index coupling in the DFB laser, and consequently, higher parameters and more stable mode of laser operation.

FABRICATION

Fabrication of the DFB semiconductor laser device 10 according to the first embodiment shown in FIG. 1, proceeds in four stages as follows:
1. first epitaxial growth of substrate and multiple quantum well structure;
2. patterning of the grating structure;
3. second epitaxial growth of the overlying layers;
4. completion of the laser fabrication (e.g. ridge formation, contacts).

The prepared substrate 12 is loaded promptly into a commercially available CVD growth chamber, and a buffer layer 40 of InP followed by the first confinement region 42, including two layers of InGaAsP, is grown. The active region 14, comprising five 1% compressively strained N-doped InGaAsP quantum wells 48, 50, 52, 54, 56, separated by four N-doped InGaAsP unstrained barriers 49, 51, 53, 55, is grown next. A 30–70 nm thick InGaAsP buffer layer 60 is grown on top of the last QW layer.

The wafer is then removed from the growth chamber and processed so as to form photolithographically a grating structure 20 by periodically etched grooves through the barrier region 18. First, a dielectric such a $SiO_2$ (not shown) is grown on the surface of the wafer, and the groove pattern is created in the dielectric layer. The grooves are etched using reactive ion etching or wet chemical etching process. The top most quantum well layer 56 is used as an etch stop layer: the etching of the InP layer 58 automatically stops at the interface of the top most quantum well layer due to selective etching. The residual dielectric is then removed. Using known crystal growth techniques, for example, a metal oxide chemical vapor deposition, an InGaAsP layer 60 is grown in the grooves to make a flat surface which is slightly above the top of the InP layer 58, thus, the grating structure 20 being defined. Second separate confinement region 28 followed by cladding layer 63 of InP and capping layer 65 of InGaAs complete the structure. Laser fabrication is then completed using a standard process. For example, to form a rectangular ridge waveguide 32 perpendicular to the grooves of the grating structure 20, a ridge mask is provided on the substrate, and the ridge is formed by etching through the capping layer 65 and top cladding layer 63, the ridge being 2 µm nominal width. The top electrode 34 is defined by the mask used in the metalization step and created in the lift-off process. The front facet of the laser is AR-coated (anti-reflection coated), the back facet being AR-coated or as-cleaved for DFB laser with a large stop band width, or HR-coated (high-reflection coated) for efficient DFB laser with a small stop band width.

For the second embodiment of the laser device 100 shown in FIGS. 3 and 4, a fabrication process is similar to that descried above with the difference of growing the barrier region 118 under the active region 114 and over the first confinement region 142. After growing a barrier layer 158 of InGaAsP overlying the first confinement region 142, the wafer is removed from the chamber to form the grating structure 120. A dielectric (not shown) is grown on the surface of the wafer, and the groove pattern is created in the dielectric layer. The grooves are etched with the first quantum well layer 156 acting as an etch stop layer, residual dielectric being removed, and a InP layer 160 grown in the grooves. The second separate confinement region 128, cladding layer 163 and the capping layer 165 are grown next, and then the laser fabrication is completed using a standard process described above.

Fabrication process for the third embodiment of the invention is also similar to that ones described above.

For all embodiments of the invention and modifications thereof, after the second regrowth, when a current confining region is formed on the active region, alternatively, a buried heterostructure may be grown. In the step of forming the grating structure, a phase mask generated by Electron Beam (EB) lithography or direct EB writing on the wafer may be also used as an alternative to a wet etching process.

Thus, beneficially the structure disclosed herein is made by two step metal organic chemical vapor deposition growth and ridge waveguide processing step, and provides the DFB laser with energy band gap modulation whose modal index coupling may be controlled independently of modal gain coupling while maintaining high dynamic single mode operation inherent for the complex coupled DFB laser.

Thus, it will be appreciated that, while specific embodiments of the invention are described in detail above, numerous variations and modifications of these embodiments fall within the scope of the invention as defined in the following claims.

What is claimed is:

1. A distributed feedback complex coupled semiconductor laser device, comprising:
   a) a substrate;
   b) an active region formed thereon and comprising a multiple quantum well structure having a plurality of quantum well layers;
   c) a barrier region formed over or under the active region and comprising a complex coupled grating defined in the barrier region only, the grating not extending beyond the barrier region into the active region and having a corrugation period comprising a plurality of sections filled with preselected quantum barrier compositions so as to provide gain/loss modulation in the most top or most bottom quantum well layer correspondingly; and
   d) means for creating a population inversion in the active region.

2. A laser device as defined in claim 1, wherein the means for creating a population inversion comprises electrical contacts for current injection into the active region.

3. A laser device as defined in claim 1, wherein the means for creating a population inversion comprises an external optical pumping source.

4. A laser device as defined in claim 1, wherein the number of the quantum barrier compositions is less or equal to the number of the sections forming the grating corrugation period, the number of the compositions being not less than two.

5. A laser device as defined in claim 1, wherein the grating corrugation period is defined by predetermined height and shape of the sections.

6. A laser device as defined in claim 5, wherein the sections have a rectangular or trapezoidal shape.

7. A laser device as defined in claim 5, wherein the height and shape of the sections define a modal index coupling independently from a modal gain/loss coupling.

8. A laser device as defined in claim 1, wherein the grating is a first order grating.

9. A laser device as defined in claim 1, wherein the grating is a chirped grating.

10. A laser device as defined in claim 1, wherein a current confining region is formed on the active region.

11. A laser device as defined in claim 10, wherein the current confining region is a ridge waveguide.

12. A laser device as defined in claim 10, wherein the current confining region is a buried hetero-structure.

13. A distributed feedback complex coupled semiconductor laser device, comprising:
   a) a semiconductor substrate;
   b) an active region formed thereon, and comprising a multiple quantum well structure, comprising a plurality of quantum well layers;
   c) a barrier region formed over or under the active region, and comprising a complex coupled grating defined in the barrier region only, the grating not extending beyond barrier region into the active region, and having a corrugation period comprising a first and a second sections filled by a first and a second quantum barrier compositions;
   d) a current confining ridge over the active region; and
   e) contacts to the current confining ridge and the substrate to provide a current injection into the active region.

14. A laser device of claim 13, wherein the first and the second quantum barrier compositions forming the first and the second sections of the grating corrugation period are InP and InGaAsP correspondingly.

15. A laser device of claim 13, wherein the grating is a first order grating.

16. A laser device of claim 13, wherein the grating is a chirped grating.

17. A laser device as defined in claim 13, wherein the current confining region is a ridge waveguide.

18. A laser device as defined in claim 13, wherein the current confining region is a buried hetero-structure.

19. A laser device as defined in claim 13, wherein the substrate is N-type and the current confining ridge is P-type.

20. A laser device as defined in claim 13, wherein the substrate is P-type and the current confining ridge is N-type.

21. A laser device as defined in claim 13, wherein the substrate is InP.

22. A laser device as defined in claim 21, capable of generating light in the wavelength range of 1.3–1.56 micrometers.

23. A laser device as defined in claim 13, wherein the substrate is GaAs.

24. A laser device as defined in claim 23, capable of generating light in the wavelength range of 0.8–0.9 micrometers.

25. A laser device as defined in claim 13, wherein a height and a shape of the first section and the second section define the grating corrugation period.

26. A laser device as defined in claim 25, wherein the first section has a rectangular or trapezoidal shape.

27. A laser device as defined in claim 13, wherein the means for creating a population inversion comprises an external optical pumping source.

28. A method of producing gain/loss modulation in a distributed feedback complex coupled semiconductor laser device comprising an active region which includes a plurality of quantum well layers, the method comprising the steps of:

forming a barrier region over or under the active region;

forming a complex coupled grating defined in the barrier region only, the grating not extending beyond the barrier region into the active region and having a corrugation period comprising a plurality of sections; and filling the sections with preselected quantum barrier compositions so as to provide gain/loss modulation in the top most or bottom most quantum well layer of the active region correspondingly.

29. A method as defined in claim 28, further providing control of modal index modulation independently from modal gain/loss modulation by varying height and shape of the sections.

30. A method of fabrication a distributed feedback complex coupled semiconductor laser device, comprising the steps of:

a) providing a substrate;

b) forming an active region thereon comprising a plurality of quantum well layers;

c) forming a barrier region over or under the active region;

(d) forming a complex coupled grating defined in the barrier region only, the grating not extending beyond the barrier region into the active region and having a corrugation period comprising a plurality of sections;

(e) filling the sections with preselected quantum barrier compositions so as to provide gain/loss modulation in the top most or bottom most quantum well layer of the active region correspondingly; and f) providing means for creating a population inversion in the active region.

31. A method as defined in claim 30, wherein the step of providing means for creating a population inversion in the active region comprises forming electrical contacts for current injection into the active region.

32. A method as defined in claim 31, wherein forming of electrical contacts comprising:

growing cladding and capping layers above the active region;

forming a current confining ridge in the capping and cladding layers.

33. A method as defined in claim 30, wherein the step of providing means for creating a population inversion in the active region comprises forming means for optical pumping from an external source.

34. A method as defined in claim 30, wherein defining the grating comprises forming a first section and a second section of the grating corrugation period filled by first and second quantum barrier compositions respectively.

35. A method as defined in claim 30, wherein defining the grating comprises patterning the sections so as to provide predetermined height and shape of the sections.

* * * * *